United States Patent [19]

Kasubuchi

[11] 4,104,728
[45] Aug. 1, 1978

[54] ELECTRONIC APPARATUS EQUIPPED ON A FLEXIBLE SUBSTRATUM

[75] Inventor: Takeshi Kasubuchi, Nara, Japan

[73] Assignee: Sharp Kabushiki Kaisha, Osaka, Japan

[21] Appl. No.: 739,002

[22] Filed: Nov. 4, 1976

Related U.S. Application Data

[63] Continuation of Ser. No. 476,864, Jun. 6, 1974, abandoned.

[30] Foreign Application Priority Data

Jun. 6, 1973 [JP] Japan .................... 48-63482

[51] Int. Cl.² ................ G06F 3/00; H01H 9/00
[52] U.S. Cl. ................ 364/712; 200/5 A; 361/398; 364/708
[58] Field of Search .......... 235/156; 200/5 A, 16 A, 200/292; 174/68.5, 117 PC, 117 F; 339/17 F; 361/395, 397–402, 412–415, 408; 364/712, 708

[56] References Cited

U.S. PATENT DOCUMENTS

| | | | |
|---|---|---|---|
| 3,676,656 | 7/1972 | Schmidt | 235/156 |
| 3,819,921 | 6/1974 | Kilby et al. | 235/156 |
| 3,911,234 | 10/1975 | Kotaka | 200/5 A |

OTHER PUBLICATIONS

Sanders Associates, Inc., Flexible Printed Wiring in all Lengths for all Layouts, Electronics, Mar. 1958, p. 20.

Primary Examiner—Malcolm A. Morrison
Assistant Examiner—Errol A. Krass
Attorney, Agent, or Firm—Birch, Stewart, Kolasch and Birch

[57] ABSTRACT

An electronic apparatus principally comprising a display unit, a mechanical contact type keyboard unit and several LSI (large-scale integrated circuit) elements including a computation circuit, a logical control circuit, a storage circuit, a program memory circuit, etc., these units and elements all being incorporated on a single flexible plate of electrical insulating material, such as a film of polyethylene-terephthalate or a polyamide. The metal depositing technology or the etching technology is applied to form a wiring pattern on the flexible plate. The LSI elements are directly mounted on the single flexible plate by utilizing the wireless bonding method, such as for example, a flip chip bond or a beam lead bond, before these elements are packed and sealed. The substratum may be secured in the inside of the apparatus in a serpentine fashion in order to make the best use of the inside space of the apparatus. It is easy to adjust the angle or the position of the display units with respect to the keyboard unit, since the display units are mounted on the flexible plate.

8 Claims, 11 Drawing Figures

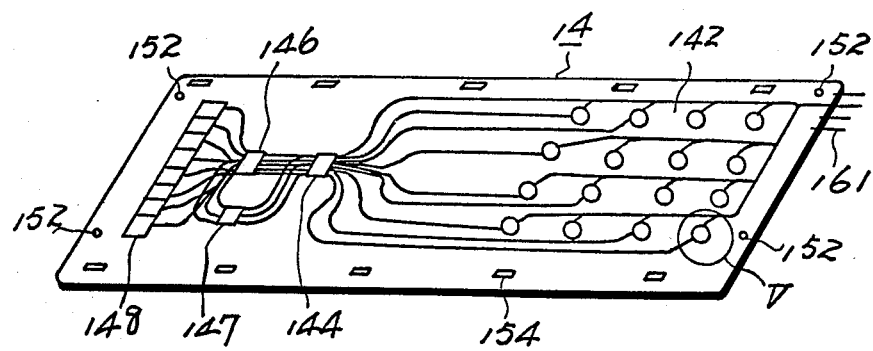
FIG. 4
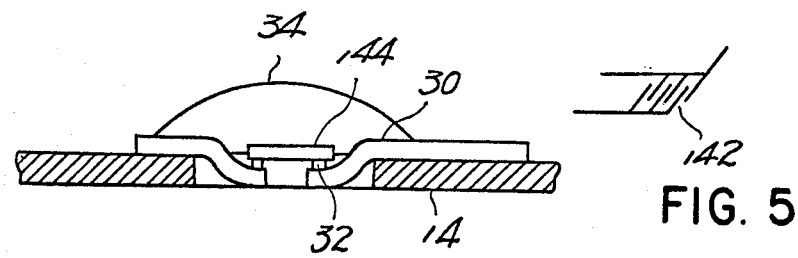
FIG. 6
FIG. 5
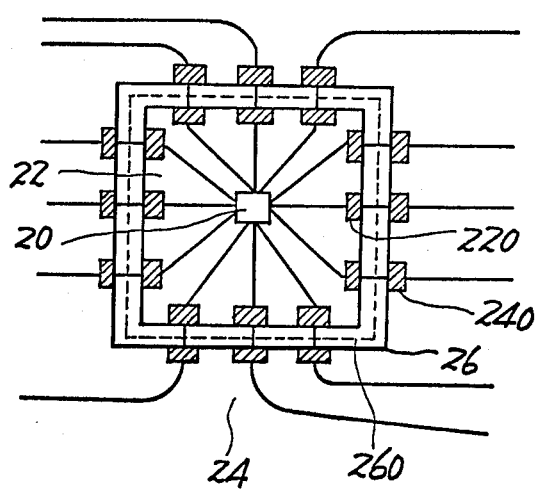
FIG. 7

ELECTRONIC APPARATUS EQUIPPED ON A FLEXIBLE SUBSTRATUM

This application is a continuation, of copending application Ser. No. 476,864, filed on Jun. 6, 1974 and now abandoned.

BACKGROUND AND SUMMARY OF THE INVENTION

The present invention relates to an electronic apparatus such as an electronic calculator having a readily handable size. More particularly, the present invention is concerned with an electronic apparatus manufactured on a single flexible insulating plate, such as a polyamide film, in order to provides a substantial reduction in size and simplicity of fabrication.

Recently, the technology for the integrated circuit has been substantially advanced, and accordingly the size of the electronic calculator has been substantially reduced. The computation circuit, the logical control circuit, the storage circuit, the program memory circuit, etc., were all included in the LSI (large-scale integrated circuit). The LSI elements, the display unit and the mechanical contact type keyboard unit were further incorporated on a single solid plate of electrical insulating material, and thus an electronic calculator was fabricated on a single plate such as a glass plate. Copending application Ser. No. 403,857, now abandoned filed Oct. 5, 1973, in the name of Isamu Washizuka, Shintaro Hashimoto and Saburo Katsui, and entitled "Calculator Construction and Method for Making Calculator" discloses a calculator embodying such a technique.

On the other hand, a flexible film such as a film of polyethylene-terephthalate or a film of a polyamide has become useful as a substratum, although the conventional substratum, for example, made from ceramics or an epoxy resin was inflexible. The flexible substratum is suitable for an apparatus which requires a substantial reduction in size. A number of wiring members on the flexible film is formed in a desired pattern by utilizing the metal depositing technology which precipitates or plates metal on such films, the etching technology which eliminates metal attached to such films, and the like.

A new method has been developed in place of the conventional IC package method, wherein an IC chip is mounted on a film plate by utilizing the bonding method, and the output signals therefrom or the input signals thereto are transported via a wiring pattern provided on the film plate. By utilizing a combination of the above-mentioned technologies, an electronic calculator may be provided on a single film when the various kinds of chips are directly mounted on the single film, if a good yield is achieved in the chip bonding technology. The manufacturing processes therefor are suitable for mass production and low cost, since the processes may be automatically controlled by utilizing conventional technology such as the technologies of chip bonding and film cutting.

The concept of an electronic apparatus disposed on a flexible substratum has been already described on pages 13 to 19 of THE ELECTRONIC SCIENCE, VOL. 22, No. 2 published February, 1972 in Japan. The title of the article is "Reduction In Size of An Electronic Apparatus and Print Wiring Technology" by Yoshio Oohara. But, in accordance with the conventional concept, the components which were mounted on the flexible substratum were IC packages or discrete elements, and the mounting thereof was performed by soldering. The soldering positions had to be fixed by the addition of reinforcing plates.

Accordingly, it is an object of the present invention to provide an electronic apparatus equipped or manufactured on a single flexible substratum, the substratum being provided with a wiring pattern thereon, and various kinds of chips mounted on the substratum by utilizing the wireless bonding method.

Another object of the present invention is to provide an electronic apparatus wherein various kinds of chips are mounted directly on small film plates, this is to say, daughter boards, respectively, and the daughter boards are physically connected to a single film plate, that is to say, a mother board, which is provided with a wiring pattern thereon.

Still another object of the present invention is to provide an electronic apparatus wherein the configuration can make best use of the characteristics of an electronic apparatus provided on a flexible substratum.

A still further object of the present invention is to obtain increased production of the above-mentioned electronic apparatus manufactured on a flexible substratum.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

In accordance with the teachings of the present invention, one or more IC chips are directly mounted on a film plate by utilizing the wireless bonding method such as the flip chip bond or the beam lead bond method. Because of the absence of the rigid plate, it is possible to bend the film plate even at the peripheral position thereof on which the chip is mounted. In addition, it is desirable in order to put the concept of the present invention into mass production that the following problems be considered.

(1) How to incorporate the mechanical contact type keyboard unit on the flexible plate as one body?

(2) How to make the best use of the advantages of using the flexible film for the substratum?

(3) How to construct the apparatus taking the yield of the chip bonding into consideration?

Each approach to solve the above-mentioned problems will be disclosed in greater detail hereinafter.

Other objects and further scope of applicability of the present invention will become apparent from the detailed description given hereinafter; it should be understood, however that the detailed description and specific examples, while indicating preferred embodiments of the invention, are given by way of illustration only, since various changes and modifications within the spirit and scope of the invention will become apparant to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

FIG. 4 is a perspective view of a flexible substratum carrying a wiring pattern formed thereon;

FIG. 5 is a partially enlarged perspective view of the part V of FIG. 4;

FIG. 6 is a cross-sectional view showing an embodiment of the chip bonding technology;

FIG. 7 is a partially enlarged plan view of the wiring pattern on the flexible substratum.

DESCRIPTION OF THE PREFERRED EMBODIMENTS

Figure 1:
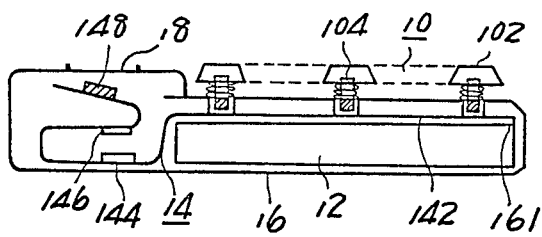
FIG. 1 is a cross-sectional view of one embodiment of the present invention.
Figure 2:
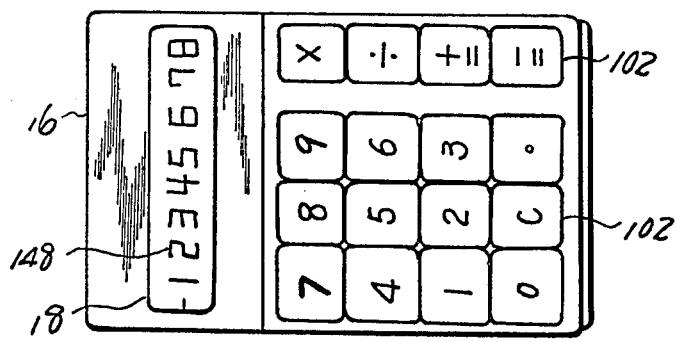
FIG. 2 is a plan view showing the embodiment of FIG. 1.

Referring now to FIGS. 1 and 2, the electronic desktop calculator embodying the present invention comprises mainly three major components, i.e., a mechanical contact type keyboard unit 10 including a plurality of key tops 102 and their associated key contacts 104, a cell case 12, and a flexible substratum 14 including key contact patterns 142, IC chips 144, 146 and display units 148 thereon. These components are secured in a housing 16. The flexible film is used for the substratum. Both the key contact patterns, and the wiring pattern among the elements are simultaneously formed on a single plate in continuous fashion, therefore effective electrical connection may be obtained therebetween without a multipin terminal. Moreover, the portion of the substratum 14 where the IC chips 144 and 146 or the display units 148 (preferably LED chips) are mounted, is adapted to be flexible in the housing 16, whereas the other portion where the key contact patterns are mounted must be fixed in order to make good contact with the key contacts 104. More particularly, the display units 148 are adjustable with respect to their location and their angle is adjustable with respect to the position of the operating panel of the keyboard unit 10. The display unit 148 is provided with a transparent windowpane 18. The flexible substratum 14 is connected to the power source via pins 161 provided at the one end of the substratum.

Figure 3:
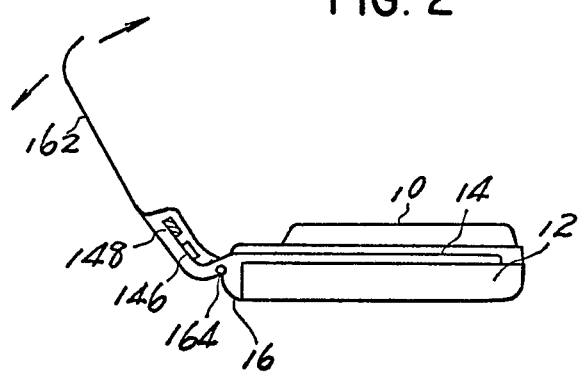
FIG. 3 is a cross-sectional view of another embodiment of the present invention.

FIG. 3 shows another embodiment of the present invention, wherein like elements corresponding to those of FIG. 1 are indicated by like numerals. The configuration of the apparatus of FIG. 3 is adapted to make the good use of the advantages of using a flexible film as the substratum.

A casing cover 162 is rotatably mounted about a shaft 164, while the display units 148 are fixed in the housing cover 162, thereby making a display angle thereof adjustable. The casing cover 162 can be closed and opened on the housing 16 when necessary, since the substratum 14 is flexible, continuous and made of a single film.

FIG. 4 shows a wiring pattern formed on the flexible substratum. The key contact patterns 142 are of a configuration suitable for making good contacts with the key contact 104 of the keyboard unit 10. When the key tops 102 are manually depressed, the key contacts 104, which are made of conductive rubbers or phosphor bronze springs, come into contact with the key contact patterns 142. A suitable configuration of the key contact patterns 142 is shown in FIG. 5 which is a partially enlarged perspective view of the part V of FIG. 4.

Manually introduced information is applied to the computation circuit chip 144 (CPU LSI) via the key contact patterns 142, and the operation outputs thereof are applied to the decoder and driver chip 146 for display. The control chip 147 for controlling, for example, the timing signals for the computation circuit chip 144 and the decoder and driver chip 146 are unavoidably comparable with present day technology. As will be understood, the necessary number of the chips is not of significant importance with respect to the principle of the present invention. Outputs of the driver chip 146 are applied to the display units 148.

The pins 161 are provided at the one end of the substratum 14 for connecting the wiring on the substratum to the power source secured within the cell case 12. The substratum 14 is fixed to the casing 16 with the use of holes 152. Perforations 154 are provided at the both sides of the substratum 14 for assisting in conveying the substratum during the process of mass production. The belt of the substratum is wound just as a roll. The belt is properly fed from the roll and the computation circuit chip 144, the decoder and driver chip 146, the display units 148, etc. are directly mounted thereon by utilizing the wireless bonding method at the appropriate positions on the substratum. Thereafter the elements are packed and the belt is cut to separate the individual substratum 14.

FIG. 6 shows an embodiment of a chip bonding. A wiring pattern 30 is formed on the substratum 14 by utilizing the metal depositing technology. The face down bonding technology is applied to mount the IC chip 144 on the substratum and to connect the IC chip to the wiring pattern via bumps 32. Thereafter the surface of the chip is sealed with the use of molded resin 34 for protecting the chip against the outside world.

By the way, it is of no practical use, in view of economy, if the whole apparatus becomes useless when only a portion of the apparatus, for example, one of the chips or one of the bonding areas becomes defective, since the present day advanced techniques are applied to manufacturing the apparatus on the flexible substratum which accordingly makes the apparatus expensive.

Although there are some technical problems associated with the manufacture of the individual components, these problems can be solved one by one by virtue of the present day developments of manufacturing processes. Therefore, in the case where all the functional units are fabricated on a single flexible substratum in accordance with the teachings of the present invention, only the total yield of the manufacturing of the apparatus should be considered.

FIG. 7 shows a wiring pattern suited for making substitution of the defective chips easy.

Wiring patterns formed on two different substrata are able to be easily connected in a manner that the two films are lapped or the wiring patterns are so arranged as to make salients from both substrata and the corresponding salients are connected respectively, since the wiring patterns on the film are formed by utilizing the metal depositing technology, compression bonding technology, etc. Moreover, the defective portion can be removed by cutting the film at the appropriate position.

There is provided a boundary area 26 between a film 22 securing one chip 20 thereon, which corresponds to the bottom of a conventional IC package. As previously described, the substratum film 24 is provided with a wiring pattern formed thereon. Both the films 22 and 24 may be physically separated from each other, the former being referred as a daughter board hereinafter and the latter as a mother board. Test pads 220 and 240 are provided on both films in such a manner that they face each other, respectively. The test pads 220 and 240 are used for putting the IC chips into the test conditions, the manner of which is similar to that used for conventional IC packages provided on the inflexible plate. If the film lapping technology is applied for connecting the two films, the boundary area 26 and machine sewed lines 260 will become unnecessary.

The machine sewed lines 260 are provided for the purpose of removing the daughter board, carrying the defactive IC chip from the mother board when necessary, and the lines are very useful for the portion of the device where the frequency of removing and replacing the daughter board is high.

It will be apparent that the positions of the test pads 240,220 are not limited to the peripheral area where the IC chips are mounted. It is effective for maintaining and checking the apparatus to provide each pair of facing test pads at the desired points suited for check within the apparatus.

Under these circumstances, it is suitable for the fabrication of the apparatus to use the mother board having a wiring pattern formed thereon and the daughter board where IC chips are mounted. FIGS. 8 through 11 inclusive show the various ways for establishing connection between the mother board and the daughter board wherein like elements corresponding to those of FIG. 7 are indicated by like numerals.

The above-described test pads are not suitable for the apparatus in some cases, since they occupy large areas. In practical use the special test pads are not provided, and the wiring paths are enlarged to a width sufficient to provide a room for soldering or painting a conductive adhesive.

Figure 8:
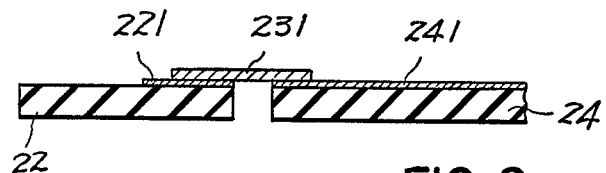
FIGS. 8 through 11 are cross-sectional views showing ways of connecting the two wiring patterns on the different substrata with each other.
Figure 9:
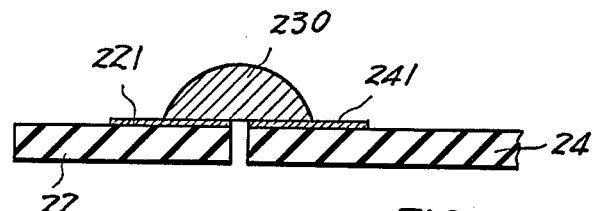
Figure 10:
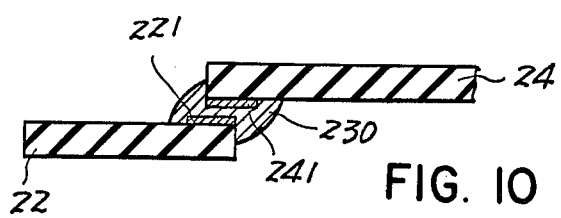
Figure 11:
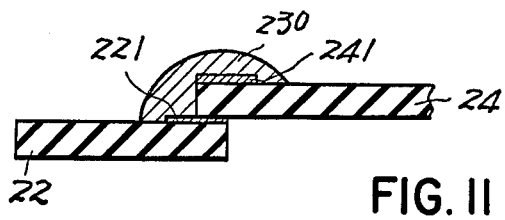

The electrical connection between the mother board 24 and the daughter board 22 is achieved in any one of the following ways. One way is the use provision of conductive salients 231 which extend the wiring pattern 241 on the mother board 24 or the wiring pattern 221 on the daughter board 22. The salients can be connected to the corresponding wiring pattern, as shown in FIG. 8. Another way consists of the positioning of the daughter board 22 adjacent the mother board 24 and the connecting of the wiring patterns 241 and 221 on both boards together with the use of solder or conductive adhesive 230, as shown in FIG. 9. FIGS. 10 and 11 show the another fashion to couple the both boards with each other, wherein the both boards are overlapped in a manner that the wiring patterns on the boards are directed to each other as shown in FIG. 10 or directed to the same direction as shown in FIG. 11. The electrical connection is achieved via the solder or conductive adhesive 230.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic apparatus comprising a housing, a flexible substratum carrying a wiring pattern formed thereon, said flexible substratum being disposed in the housing in a serpentine fashion at at least one portion thereof, a display unit formed directly on the flexible substratum, said display unit being adjustable with respect to its angle or its position thereof because of the flexibility of the substratum; a semiconductor circuit unit including at least a computation function circuit formed directly on the flexible substratum and protected from the environment with a resinous material; key contact patterns formed directly on the flexible substrate and a keyboard unit disposed on the flexible substratum, said keyboard unit containing a plurality of key contacts which are adapted to make contact with the key contact patterns.

2. An electronic apparatus comprising a flexible substratum carrying a wiring pattern formed thereon; a display unit formed on the flexible substratum; a semiconductor circuit unit including at least a computation function circuit formed on the flexible substratum and protected from the environment with a resinous material; key contact patterns formed directly on the flexible substratum and a keyboard unit disposed on the flexible substratum, said keyboard unit containing a plurality of key contacts which are adapted to make contact with the key contact patterns, wherein the flexible substratum comprises a flexible mother board carrying a wiring pattern formed thereon and one or more flexible daughter boards connected to the mother board, said keyboard unit being disposed on the mother board and said remaining functional units formed directly on the daughter boards.

3. An electronic apparatus comprising a flexible substratum carrying a wiring pattern formed thereon; a display unit formed directly on one end of the flexible substratum; key contact patterns formed directly on the other end portion of the flexible substratum; a semiconductor circuit unit including at least a computation function circuit formed directly on the middle portion of the flexible substratum and protected from the environment with a resinous material; and a keyboard unit disposed on the flexible substratum, said keyboard unit containing a plurality of key contacts which are adapted to make contact with the key contact patterns.

4. An electronic apparatus comprising a housing containing a body provided with a cover rotatable about a shaft; a flexible substratum carrying a wiring pattern formed thereon, said flexible substratum being secured in the housing in a manner such that a portion of said substratum is disposed in the cover of the housing and a portion thereof is formed in the body of the housing; a display unit formed directly on the flexible substratum disposed in the cover of the housing, a semiconductor circuit unit including at least a computation function circuit, formed directly on the flexible substratum and protected from the environment with a resinous material; key contact patterns formed directly on the flexible substratum and a keyboard unit disposed on the flexible substratum in the body of the housing, said keyboard unit containing a plurality of key contacts which are adapted to make contact with the key contact patterns.

5. An electronic apparatus comprising a housing containing a body provided with a cover rotatable about a shaft; a flexible mother board carrying a wiring pattern formed thereon, said flexible mother board being disposed in the housing in a manner such that a portion of the mother board is positioned in the cover of the casing; a display unit formed directly on the mother board in the cover of the housing; a flexible daughter board connected to the mother board; a semiconductor circuit unit including at least a computation function circuit, formed directly on the daughter board and protected from the environment with a resinous material and a keyboard unit disposed on the mother board in the body of the housing.

6. The apparatus of claim 4, wherein the flexible substratum extends from the body to the cover through the shaft.

7. The apparatus of claim 5, wherein the flexible substratum extends from the body to the cover through the shaft.

8. In an electronic calculator comprising a housing consisting of an upper cabinet and a lower cabinet, said upper and lower cabinets being movably connected to each other through a hinge means, a flexible substratum disposed in both the upper cabinet and the lower cabinet for carrying electronic components for said electronic calculator in said upper and lower cabinets, the electronic components containing a display unit, a computation circuit unit and a keyboard unit, wherein the electronic calculator is in an operating state when the upper cabinet is moved to an open position from the lower cabinet and the electronic calculator is in a non-operating state when the upper cabinet is closed on the lower cabinet, the improvement which comprises providing collapsible interconnection conductors formed directly in a printed pattern on the flexible substratum for providing flexibility for the interconnections disposed at the junction of the upper cabinet and the lower cabinet, thereby providing communication between the electronic elements disposed in the upper cabinet and the electronic elements disposed in the lower cabinet when the position of the upper cabinet is changed relative to the position of the lower cabinet, and means for securing said collapsible interconnection conductors on said hinge means, whereby flexibility is provided for the calculator housing through said hinge means and for the interconnection about said hinge means through said collapsible conductors.

* * * * *